(12) United States Patent
Hoshikawa et al.

(10) Patent No.: US 11,795,568 B2
(45) Date of Patent: Oct. 24, 2023

(54) PRODUCTION APPARATUS FOR GALLIUM OXIDE CRYSTAL CAPABLE OF PREVENTING HARMFUL SUBSTANCES FORMED IN FURNACE FROM BEING DIFFUSED TO SURROUNDINGS OF FURNACE

(71) Applicants: Fujikoshi Machinery Corp., Nagano (JP); SHINSHU UNIVERSITY, Nagano (JP)

(72) Inventors: Keigo Hoshikawa, Nagano (JP); Toshinori Taishi, Nagano (JP); Takumi Kobayashi, Nagano (JP); Yoshio Otsuka, Nagano (JP); Etsuko Ohba, Nagano (JP)

(73) Assignees: FUJIKOSHI MACHINERY CORP., Nagano (JP); SHINSHU UNIVERSITY, Nagano (JP)

( * ) Notice: Subject to any disclaimer, the term of this patent is extended or adjusted under 35 U.S.C. 154(b) by 0 days.

(21) Appl. No.: 17/555,680

(22) Filed: Dec. 20, 2021

(65) Prior Publication Data

US 2022/0243358 A1    Aug. 4, 2022

(30) Foreign Application Priority Data

Jan. 29, 2021   (JP) ................. 2021-013100

(51) Int. Cl.
*C30B 11/00* (2006.01)
*C30B 29/16* (2006.01)

(52) U.S. Cl.
CPC ............ *C30B 11/003* (2013.01); *C30B 29/16* (2013.01)

(58) Field of Classification Search
CPC ..... C30B 11/00; C30B 11/003; C30B 11/006; C30B 29/00; C30B 29/10; C30B 29/16; C30B 35/00; C30B 35/002; F27B 14/08; F27B 2014/0825; F27D 7/06; F27D 2019/0031
USPC ......... 117/11, 13, 73, 81, 83, 200, 201, 204, 117/223, 937, 944
See application file for complete search history.

(56) References Cited

U.S. PATENT DOCUMENTS

| | | | |
|---|---|---|---|
| 2003/0015090 A1* | 1/2003 | Shore | .................... B08B 15/002 96/397 |
| 2015/0011076 A1* | 1/2015 | Demars | .................... C30B 25/14 118/722 |
| 2017/0306521 A1* | 10/2017 | Hoshikawa | ....... H01L 21/02565 |
| 2020/0115817 A1* | 4/2020 | Hoshikawa | ............. C30B 29/16 |

FOREIGN PATENT DOCUMENTS

JP    2017 193466    10/2017

* cited by examiner

*Primary Examiner* — Kenneth A Bratland, Jr.
(74) *Attorney, Agent, or Firm* — Stephen J. Weyer, Esq.; Stites & Harbison, PLLC

(57) ABSTRACT

A production apparatus for a metal oxide single crystal according to one aspect of the present invention includes: a furnace having an interior heated to a temperature of 1,500° C. or more in an oxidative atmosphere, a heater heating the interior of the furnace, an inlet pipe being disposed in a lower part of the furnace and connecting an interior and an exterior of the furnace, an exhaust pipe being disposed in an upper part of the furnace and connecting an interior and an exterior of the furnace, a duct being disposed above the furnace, and an exhaust fan and a harmful substance elimination device being disposed in the middle of the duct.

3 Claims, 3 Drawing Sheets

PRODUCTION APPARATUS FOR GALLIUM OXIDE CRYSTAL CAPABLE OF PREVENTING HARMFUL SUBSTANCES FORMED IN FURNACE FROM BEING DIFFUSED TO SURROUNDINGS OF FURNACE

CROSS-REFERENCE TO RELATED APPLICATION

This application is based upon and claims the benefit of priority of the prior Japanese Patent Application No. 2021-013100, filed on Jan. 29, 2021, and the entire contents of which are incorporated herein by reference.

TECHNICAL FIELD

The present invention relates to a production apparatus for a metal oxide single crystal.

BACKGROUND ART

Known production apparatuses for a metal oxide single crystal include a production apparatus for a single crystal of gallium oxide (hereinafter a "production apparatus for a metal oxide single crystal" and a "production apparatus for a single crystal of gallium oxide" each may be referred simply to as an "apparatus", and a "single crystal of gallium oxide" may be referred simply to as a "gallium oxide crystal").

In the production apparatus for a gallium oxide crystal described in PTL 1 (JP-A-2017-193466), a crucible disposed in a crystal growing furnace (which may be hereinafter referred simply to as a "furnace") in an air atmosphere is heated with a resistance heater or a high frequency induction heater, so as to melt the material of gallium oxide (crystal material) housed in the crucible, and the material melt is crystallized. The crystal growing method applied may be the VB method (vertical Bridgeman method), the VGF method (vertical gradient freeze method), the HB method (horizontal Bridgeman method), the HGF method (horizontal gradient freeze method), the CZ method (Czochralski method), the EFG method, and the like, and in any of these methods applied, it is necessary to melt the crystal material by heating. The melting point of gallium oxide is approximately 1,800° C. (for example, approximately 1,795° C. for $\beta$-$Ga_2O_3$), and the furnace in the production apparatus for gallium oxide crystal is a high temperature furnace, the interior of which is heated to 1,800° C. or more.

SUMMARY OF INVENTION

Technical Problem

In the case where a production apparatus for metal oxide single crystal equipped with a high temperature furnace (which herein means a furnace heated to approximately 1,500° C. or more) in an oxidative atmosphere (which herein means an atmosphere containing an oxidative gas, such as oxygen, and includes an oxygen atmosphere and an air atmosphere) as exemplified by the production apparatus for a gallium oxide crystal described in PTL 1 is operated, and the interior of the furnace is heated, nitrogen oxides ($NO_x$) formed by bonding nitrogen and oxygen in the furnace, and other harmful substances may be formed, for example, by the action of light emitted from the heater under a high temperature condition by heating. When the harmful substances are diffused to the surroundings of the furnace (for example, to the room where the furnace is placed), there is a concern that, for example, nitrogen oxides cause an offensive odor in the surroundings of the furnace, and with an increased concentration thereof, adversely affect the human health. There is also a concern that the apparatus components, such as the metal terminals of the electric device, are corroded thereby, and the apparatus fails to function normally, resulting in deterioration of the crystal quality.

Solution to Problem

The present invention has been accomplished under the circumstances, and one or more aspects of the present invention are directed to a production apparatus for a metal oxide single crystal that is capable of preventing harmful substances formed in a high temperature furnace in an oxidative atmosphere represented by nitrogen oxides from being diffused to the surroundings of the furnace.

In view of the above, the following embodiments are described below.

A production apparatus for a metal oxide single crystal according to one aspect of the present invention includes:
  a furnace having an interior heated to a temperature of 1,500° C. or more in an oxidative atmosphere,
  a heater heating the interior of the furnace,
  an inlet pipe being disposed in a lower part of the furnace and connecting an interior and an exterior of the furnace,
  an exhaust pipe being disposed in an upper part of the furnace and connecting an interior and an exterior of the furnace,
  a duct being disposed above the furnace, and
  an exhaust fan and a harmful substance elimination device being disposed in the middle of the duct.

According to the structure, the gas flowing out from the interior of the furnace can be actively withdrawn to the duct by driving the exhaust fan, and can be exhausted to the prescribed place after eliminating the contained harmful substances with the harmful substance elimination device. Accordingly, the harmful substances formed in the furnace can be prevented from being diffused to the surroundings of the furnace.

It is preferred that an upper end of the exhaust pipe and a lower end of the duct are disposed apart from each other and directed facing each other. According to the structure, the gas in the furnace exhausted from the exhaust pipe can be introduced and withdrawn to the duct that opens in the same axis as the exhaust direction. Accordingly, the gas flowing out from the interior of the furnace can be allowed to flow into the duct and removed with substantially no leakage.

It is preferred that the production apparatus further include a shroud surrounding an upper part and a side of the furnace, and an opening provided in an upper part of the shroud is connected to the lower end of the duct. According to the structure, the side of the furnace is surrounded, and thereby the gas flowing outside the furnace through the other parts than the exhaust pipe, such as gaps formed in the furnace, can be prevented from being diffused to the surroundings. Furthermore, the upper part of the furnace is surrounded, and thereby the gas in the furnace exhausted from the exhaust pipe can be prevented further certainly from being diffused.

The heater may be a resistance heater or an induction heater.

The furnace may be a vertical Bridgeman furnace.

The metal oxide may be gallium oxide.

Advantageous Effects of Invention

According to one or more aspects of the present invention, harmful substances formed in a high temperature furnace in an oxidative atmosphere can be prevented from being diffused to the surroundings of the furnace.

DESCRIPTION OF EMBODIMENTS

An embodiments of the present invention will be described in detail below with reference to the drawings. The production apparatus for a metal oxide single crystal according to the present embodiment is a production apparatus for a metal oxide single crystal where the interior of the furnace is heated to a temperature of 1,500° C. or more in an oxidative atmosphere. The condition that the "interior of the furnace is heated to a temperature of 1,500° C. or more" herein means that the entire area of the interior of the furnace may not necessarily reach 1,500° C. or more, but it suffices that an area having a temperature reaching 1,500° C. or more exists in any part of the interior of the furnace (which is the same as for the similar expressions in the description herein). For example, the vertical Bridgeman method crystallizes a material melt in the vertical direction by forming a vertical temperature gradient in the furnace, and therefore the temperature distribution in the crystal growing furnace may not be uniform in some cases.

Figure 1:
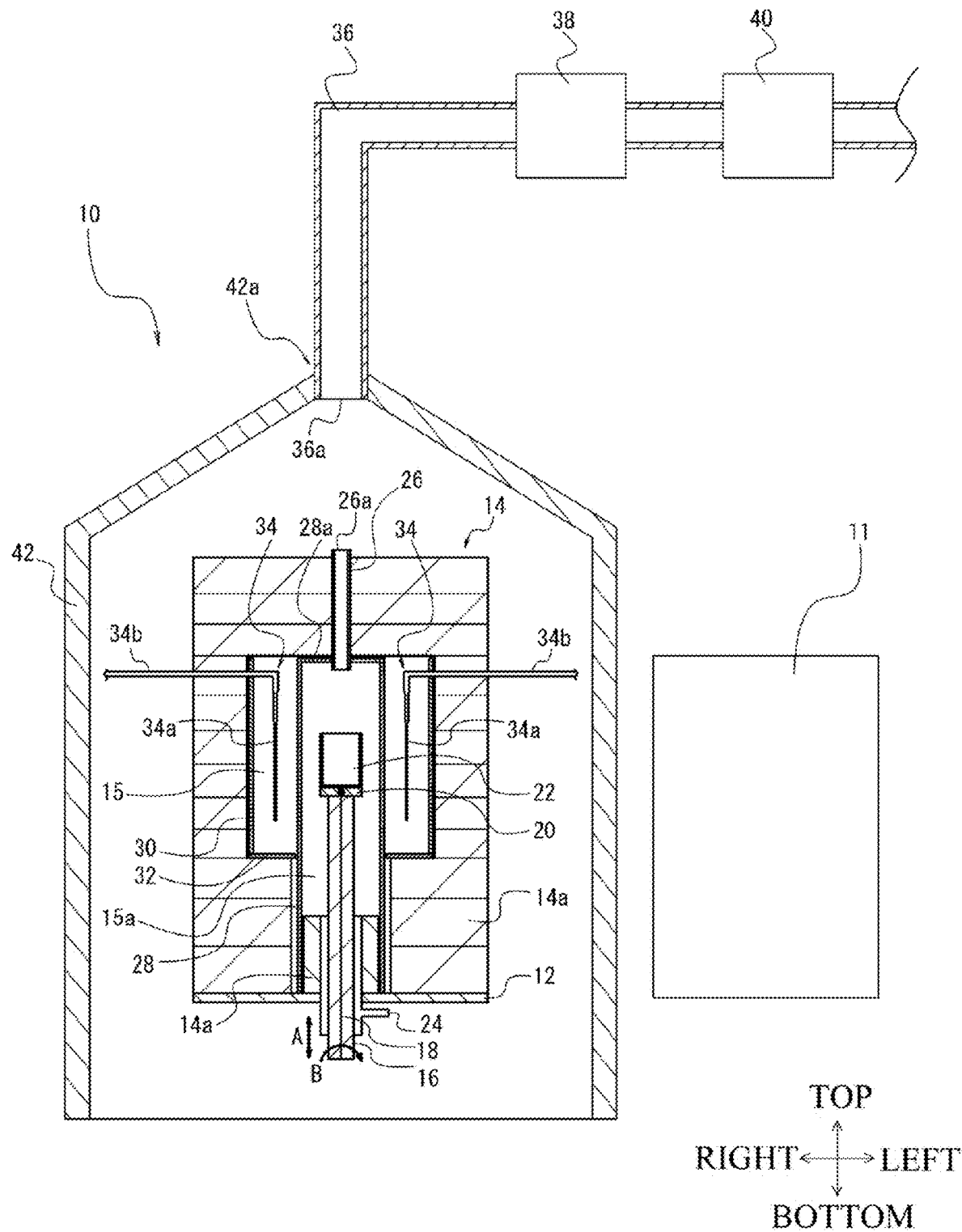
FIG. 1 is a schematic illustration (vertical cross sectional view) showing an example of a production apparatus for a metal oxide single crystal according to one embodiment of the present invention.

FIG. 1 is a schematic illustration (vertical cross sectional view) showing an example of the production apparatus 10 for a metal oxide single crystal according to the present embodiment, and specifically the production apparatus 10 for a gallium oxide crystal. The production apparatus 10 for a gallium oxide crystal will be described below as one example of the production apparatus 10 for a metal oxide single crystal.

The production apparatus 10 for a gallium oxide crystal shown in FIG. 1 has a furnace 14 for growing a gallium oxide crystal by heating the interior thereof (i.e., a vertical Bridgeman furnace using the vertical Bridgeman method) and an electric device 11 including a controlling device (which is not shown in the figure) for controlling the operation of the furnace 14. The furnace 14 is disposed on a base substrate 12, and includes plural ring members 14a formed in a ring shape each having a prescribed height by bonding plural divided pieces (which are not shown in the figure) each formed of a heat resistant material, which are laminated in the vertical direction into a cylinder shape, so as to form a furnace space 15 in the interior thereof. A recessed portion 15a recessed along the center axis of the furnace 14 is formed on the bottom surface of the furnace space 15. In the following description, the "interior of the furnace 14" may be expressed as the "furnace space 15" for convenience of comprehension, and the interior of the furnace 14 and the furnace space 15 show the same region.

A crucible shaft 16 is extended in the vertical direction along the center axis of the furnace 14, penetrating through the base substrate 12, reaching around the height center of the furnace space 15 through the recessed portion 15a. The crucible shaft 16 is provided freely vertically movably (see the arrow A) and freely rotatably (see the arrow B) with a driving mechanism (which is not shown in the figure).

An adapter 20 for supporting the crucible 22 is provided on the crucible shaft 16, and the crucible 22 is placed on the adapter 20. A thermocouple 18 is disposed inside the crucible shaft 16 and the adapter 20, so as to enable to measure the temperature of the crucible 22. The crucible 22 for growing a gallium oxide ($\beta$-$Ga_2O_3$) crystal is preferably a crucible 22 formed of a Pt based alloy, such as a Pt—Rh alloy having a Rh content of 10 to 30% by weight (more preferably 10 to 20% by weight) or a PT-Ir alloy having an Ir content of 20 to 30% by weight.

The periphery of the crucible shaft 16 is surrounded by the ring members 14a formed of the heat resistant material from the bottom surface of the recessed portion 15a to around the height center thereof, and the lower portion of the furnace 14 is thermally insulated. In taking the crucible 22 in or out from the furnace 14, the ring members 14a disposed in the recessed portion 15a may be detached from the lower part, and the crucible 22 may be taken in and out from the bottom of the recessed portion 15a along with the crucible shaft 16.

An inlet pipe 24 penetrating through the base substrate 12 and opening in the recessed portion 15a is provided to connect the interior and the exterior of the furnace 14. An exhaust pipe 26 penetrating through the upper part of the furnace 14 along the center axis of the furnace 14 is provided to connect the interior and the exterior of the furnace 14. According to the structure, the interior of the furnace 14 may be made to be an air atmosphere, but in heating the interior of the furnace 14, for example, the atmosphere in the furnace 14 (such as the oxygen concentration) may be regulated by controlling the flow rate of the air flowing through the inlet pipe 24. The interior of the furnace 14 may be regulated to a prescribed atmosphere (such as an oxygen atmosphere) by actively introducing a prescribed gas (such as oxygen) through the inlet pipe 24. It suffices that the inlet pipe 24 is provided on the lower side of the furnace 14, and the exhaust pipe 26 is provided on the upper side of the furnace 14, and the positions of the inlet pipe 24 and the exhaust pipe 26 are not limited.

In the furnace space 15, a furnace core pipe 28 surrounding the crucible 22 and the crucible shaft 16 and a furnace pipe 30 surrounding the furnace core pipe 28 are provided, and heaters 34 are provided between the furnace core pipe 28 and the furnace pipe 30.

The furnace core pipe 28 is extended from the bottom surface of the recessed portion 15a to the uppermost surface of the furnace space 15, and a top board 28a is provided on the upper part thereof, so as to cover the side and the top of the crucible 22 and the crucible shaft 16 (provided that the lower end of the exhaust pipe 26 is opened in the interior of the furnace 14 (i.e., the interior of the furnace core pipe 28) by penetrating through the top board 28a). The crucible 22 and the heaters 34 can be segregated from each other with the furnace core pipe 28. Accordingly, even when a part of the heater 34 or the like is melted at a high temperature, the molten matter can be prevented from being mixed into the crucible 22 (i.e., into the gallium oxide crystal).

The furnace pipe 30 is extended from the bottom surface to the uppermost surface of the furnace space 15, so as to surround the side of the furnace core pipe 28 from around the height center to the upper part thereof. A supporting member 32 in a ring shape is provided on the bottom surface of the furnace space 15 to support the furnace pipe 30. The furnace pipe 30 can block between the heaters 34 and the ring members 14a constituting the outer wall of the furnace space 15, so as to prevent the ring members 14a from suffering sintering, deformation, and cracking due to a high temperature. Furthermore, the heat from the heaters 34 can be reflected thereby to the side of the furnace core pipe 28 to heat the furnace space 15, and thereby the heat can be used without waste. The furnace core pipe 28 and the furnace pipe 30 are also formed of a heat resistant material as similar to the ring members 14a.

The heaters 34 each are a resistance heater generating heat through electrification, and as shown in FIG. 1, a heating part 34a on the top side thereof is extended in the vertical direction in the furnace 14, and a conductive part 34b on the base side is bent in the horizontal direction, penetrates through the side of the furnace 14, and is connected to an external electric power source (which is not shown in the figure) outside the furnace 14. The conductive part 34b may not be bent but may be extended in the vertical direction to penetrate through the upper part of the furnace 14 (which is not shown in the figure). The plural heaters 34 are disposed to surround in a circle the crucible 22 positioned on the center axis in the furnace 14 with the furnace core pipe 28 intervening therebetween (provided that the number of the heaters 34 is not limited although two heaters are shown in FIG. 1). According to the structure described above, a temperature gradient in the vertical direction with a higher temperature in the upper portion and a lower temperature in the lower portion can be formed around the crucible 22 in the furnace 14. As for the resistance heater for growing a gallium oxide ($\beta$-$Ga_2O_3$) crystal, a heater 34 formed of $MoSi_2$ having a tip thereof formed in a U-shape is preferably used.

The heater 34 may be a high frequency induction heater. In this case, a high frequency coil may be provided on the outer periphery of the furnace 14, and heaters having a cylindrical shape having a closed upper end may be provided to surround the crucible 22 in the furnace space 15. As for the high frequency induction heater for growing a gallium oxide ($\beta$-$Ga_2O_3$) crystal, a heater formed of a Pt based alloy, such as a Pt—Rh alloy having a Rh content of 10 to 30% by weight, having a zirconia coating on the entire surface thereof is preferably used (the structures relating to the high frequency induction heater are not shown in the figure).

The production apparatus 10 for a gallium oxide crystal can produce a gallium oxide (such as $\beta$-$Ga_2O_3$) crystal by using the vertical Bridgeman method, for example, in the following manner. A seed crystal is housed in the bottom of the crucible 22, and a material of gallium oxide (crystal material) is then housed on the seed crystal. The crucible 22 is placed on the crucible shaft 16 (i.e., the adapter 20), and the interior of the furnace 14 (i.e., the crucible 22) is heated to approximately 1,800° C. with the heaters 34, so as to melt the crystal material. A temperature gradient in the vertical direction with a higher temperature in the upper portion and a lower temperature in the lower portion is formed around the crucible 22 in the furnace 14, and the crucible 22 is descended through the crucible shaft 16. According to the procedure, a crystal can be grown from the lower side of the material melt starting from the seed crystal through the solidification phenomenon caused by cooling the material melt.

Subsequently, the mechanism for preventing the diffusion of the gas containing harmful substances formed in the furnace 14, which is one of the features of the present invention, will be described. The "harmful substances" referred herein mean substances that are formed in a high temperature furnace in an oxidative atmosphere, have, for example, an offensive odor and corrosiveness to metals, and adversely affect any of the environments, the human bodies, the apparatus 10, and the crystal quality, and specific examples thereof include nitrogen oxides ($NO_x$).

The production apparatus 10 for a gallium oxide crystal according to the present embodiment includes a duct 36 disposed above the furnace 14. According to the structure, the gas flowing out from the interior of the furnace 14 can be exhausted to the prescribed place through the duct 36.

The production apparatus 10 also includes an exhaust fan 38 and a harmful substance elimination device 40 disposed in the middle of the duct 36. According to the structure, the gas flowing out from the interior of the furnace 14 can be actively withdrawn to the duct 36 by driving the exhaust fan 38, and can be exhausted to the prescribed place after eliminating the contained harmful substances with the harmful substance elimination device 40. Accordingly, the harmful substances formed in the furnace 14 can be prevented from being diffused to the surroundings of the furnace 14.

In FIG. 1, the exhaust fan 38 is disposed on the upstream side of the duct 36, and the harmful substance elimination device 40 is disposed on the downstream side thereof, but it is possible that the harmful substance elimination device 40 is disposed on the upstream side, and the exhaust fan 38 is disposed on the downstream side. Plural exhaust fans 38 and plural harmful substance elimination devices 40 may be disposed.

The exhaust fan 38 is not particularly limited, and may be a known fan having an exhausting function, and examples thereof include a sirocco fan, a diagonal flow fan, and a turbo fun.

The harmful substance elimination device 40 is not particularly limited, and a known device having a function eliminating harmful substances may be used corresponding to the kind of the harmful substances. The known harmful substance elimination methods generally include a method of scavenging or absorbing the harmful substances, a method of detoxifying the harmful substance through dilution, and a method of chemically decomposing the harmful substances or chemically converting the harmful substances to harmless substances. More specifically, the known methods of eliminating nitrogen oxides ($NO_x$) include a dry method and a wet method. Examples of the dry method include a method of reducing nitrogen oxides ($NO_x$) to nitrogen ($N_2$) through the catalytic action by adding a reducing gas, such as ammonia, thereto. Examples of the wet method include a method of absorbing nitrogen oxides ($NO_x$) by passing through an aqueous solution of an alkali or an acid. The harmful substance elimination device 40 may be any of various devices having the function of eliminating the harmful substances by these methods.

The lower end 36a of the duct 36 and the upper end 26a of the exhaust pipe 26 are disposed apart from each other and directed facing each other in the furnace 14. According to the structure, the gas in the furnace 14 exhausted from the exhaust pipe 26 can be introduced and withdrawn to the duct 36 that opens in the same axis as the exhaust direction. Accordingly, the gas flowing out from the interior of the furnace 14 can be allowed to flow into the duct 36 and removed with substantially no leakage.

A structure in which the duct 36 and the exhaust pipe 26 are directly connected to each other can allow the gas in the furnace 14 to flow into the duct 36 more securely. In the structure, however, it is difficult to control the atmosphere (such as the kind, the concentration, the flow rate, and the like of the gas) in the furnace 14. Furthermore, the amount of the gas flowing from the inlet pipe 24 into the interior of the furnace 14 due to the action of the exhaust fan 38 is increased, and thereby it is difficult to control the temperature (such as the formation of the temperature gradient) in the furnace 14. As a result, there is a concern of deterioration of the crystal quality.

According to the present embodiment, on the other hand, the lower end 36a of the duct 36 and the upper end 26a of the exhaust pipe 26 are directed facing each other, and thereby the gas in the furnace 14 exhausted from the exhaust pipe 26 can be allowed to flow into the duct 36 without diffusion of the gas although the duct 36 and the exhaust pipe 26 are apart from each other. Furthermore, the atmosphere and the temperature distribution in the furnace 14 are not adversely affected but can be controlled, thereby preventing the crystal quality from being deteriorated.

It is considered that the region around the heaters 34 becomes the highest temperature in the furnace space 15, and thus is a region where harmful substances are most likely formed. As shown in FIG. 1, on the other hand, the furnace space 15 where the exhaust pipe 26 is opened and the furnace space 15 where the heaters 34 are disposed are segregated from each other with the furnace core pipe 28, and therefore the gas in the region around the heaters 34 is difficult to exhaust through the exhaust pipe 26 in this structure.

In view of the situation, in the present embodiment, a shroud 42 surrounding the top and the side of the furnace 14 is provided, and an opening 42a provided in the upper part of the shroud 42 is connected to the lower end 36a of the duct 36. According to the structure, the side of the furnace 14 is surrounded, and thereby the gas flowing outside the furnace 14 through the other parts than the exhaust pipe 26, such as a gap formed in the furnace 14 (e.g., a gap between the conductive part 34b of the heater 34 (i.e., the resistance heater) and the heat resistant material constituting the furnace 14 in the case where the conductive part 34b penetrates through the furnace 14 and is connected to the external electric power source outside the furnace 14) can be prevented from being diffused to the surroundings. This gas is mainly the aforementioned gas in the region around the heaters 34, which is difficult to exhaust through the exhaust pipe 26, and the shroud 42 can prevent harmful substances contained in the gas from being diffused. Furthermore, the upper part of the furnace 14 is surrounded, and thereby the gas in the furnace 14 exhausted from the exhaust pipe 26 can be prevented more certainly from being diffused.

The shroud 42 may also surround the lower part of the furnace 14 in addition to the upper part and the side of the furnace 14. According to the structure, the gas flowing outside the furnace 14 through the other parts than the exhaust pipe 26, such as gaps formed in the furnace 14, can be prevented further securely from being diffused to the surroundings.

The shroud 42 may be formed of a plate or sheet material of a gas barrier material, such as a metal or a synthetic resin having gas barrier property. The shroud 42 may be entirely formed of the gas barrier material, or the gas barrier material may be coated on another material to form a gas barrier layer.

EXAMPLES

Figure 2A:
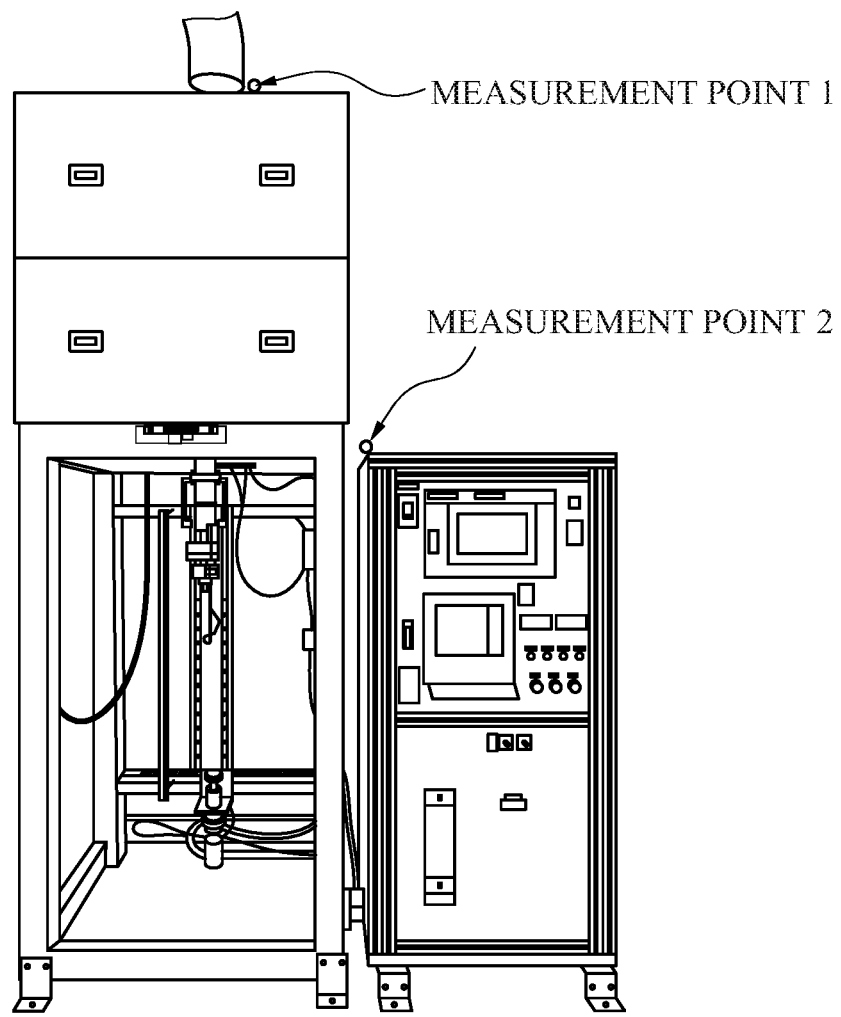
FIGS. 2A and 2B are photographs of the production apparatus for a gallium oxide crystal in Test 1.
Figure 2B:
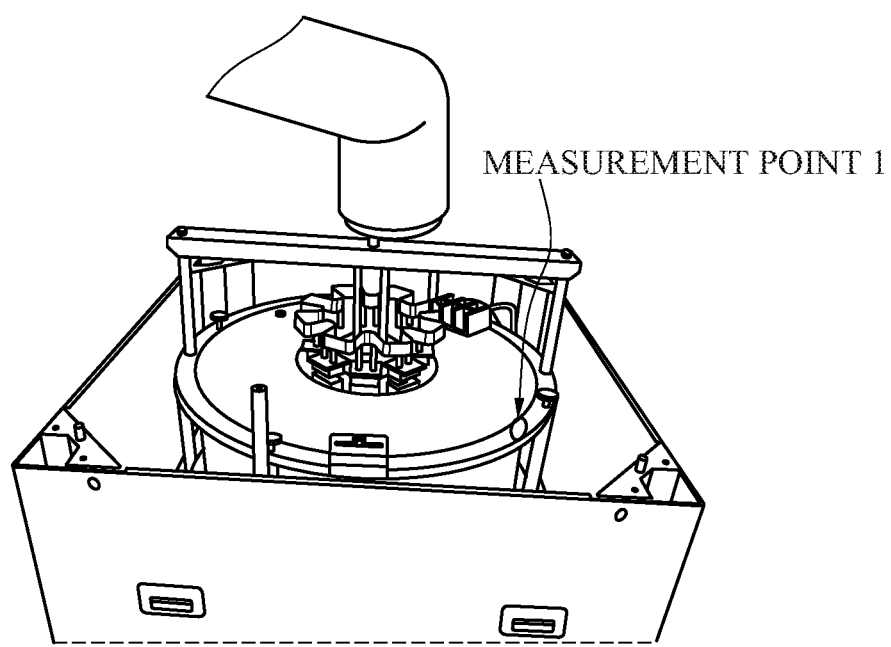

Test 1

β-$Ga_2O_3$ crystal was grown with the production apparatus 10 for a gallium oxide crystal (vertical Bridgeman furnace) according to the present embodiment, and the gas environments above and around the furnace 14 during the growth were measured. FIGS. 2A and 2B are photographs of the production apparatus 10 for a gallium oxide crystal (FIG. 2A is a photograph of the front view, and FIG. 2B is a photograph of the upper part).

In the crystal growth, the heaters 34 were resistance heaters, and the atmosphere in the furnace 14 was appropriately regulated to the atmosphere suitable for growing a β-$Ga_2O_3$ crystal in an oxidative atmosphere.

For exhausting the gas in the furnace 14, the shroud 42 was formed of a steel plate and surrounded only the side of the furnace 14 as shown in FIGS. 2A and 2B.

The gases of the prescribed positions were collected and measured for the concentrations of various harmful substances with a measuring device. The temperature conditions in collecting the gases were: room temperature: 26.15° C., temperatures of the heaters: 1,816.70° C. and 1,817.85° C. (two heaters among the plural heaters 34 were measured), and temperatures of the interior of the furnace: 1,783.55° C. and 1,779.55° C. (two positions at the crucible 22 were measured).

The gas collection points (measurement points) were the position on the upper surface of the furnace 14 where the exhaust pipe 26 was not disposed (measurement point 1) and the position on the upper surface of the electric device 11 adjacent to the furnace 14 (measurement point 2), as shown by the circles in FIGS. 2A and 2B.

The measurement device used was a gas sampling pump kit GV-100S (trade name), available from Gastec Corporation. The results are shown in Table 1.

TABLE 1

| Measurement item (harmful substance) | Measurement point 1 | Measurement point 2 |
|---|---|---|
| Nitrogen dioxide ($NO_2$) | 2 ppm | — |
| Hydrogen sulfide ($H_2S$) | — | — |
| Hydrogen chloride (HCl) | — | — |
| Nitric acid ($HNO_3$) | — | — |
| Hydrogen fluoride (HF) | — | — |
| Hydrogen peroxide ($H_2O_2$) | — | — |

—: not detected

At the upper part of the furnace 14 (measurement point 1), 2 ppm of nitrogen dioxide ($NO_2$) was detected, but no other harmful substances were detected. This showed that at least nitrogen dioxide ($NO_2$) as a harmful substance was formed from the furnace 14 heated to a high temperature of approximately 1,800° C. (the melting point of β-$Ga_2O_3$ was approximately 1,795° C.) in an oxidative atmosphere. However, the detected amount thereof was as small as 2 ppm, which showed that nitrogen dioxide was substantially removed with the exhaust mechanism (particularly the duct 36 and the exhaust fan 38) according to the present embodiment.

The harmful substances including nitrogen dioxide ($NO_2$) were not detected from the surroundings of the furnace 14 (measurement point 2). This showed that the gas containing harmful substances formed in the furnace 14 was securely prevented from being diffused to the surroundings of the furnace 14.

Test 2

The gas environments around an operational furnace and a non-operational furnace were investigated for an ordinary production apparatus for a gallium oxide crystal (vertical Bridgeman furnace) that was not equipped with the exhaust mechanism according to the present embodiment (i.e., the duct 36, the exhaust fan 38, the harmful substance elimination device 40, and the shroud 42).

In this test, a polystyrene container having a BTB (bromothymol blue) solution therein was placed at the position on the upper surface of the electric device 11 adjacent to the furnace 14, which was the same position as measurement point 2 in Test 1.

After the placement of the container, a $\beta$-$Ga_2O_3$ crystal was grown in the same manner as in Test 1 for the operational furnace, and the apparatus was not operated and allowed to stand for the non-operational furnace.

The BTB solutions after 48 hours from the placement of the container each were visually confirmed for the color change. The BTB solution at the time of the placement was green showing neutrality.

Figures 3A, 3B:
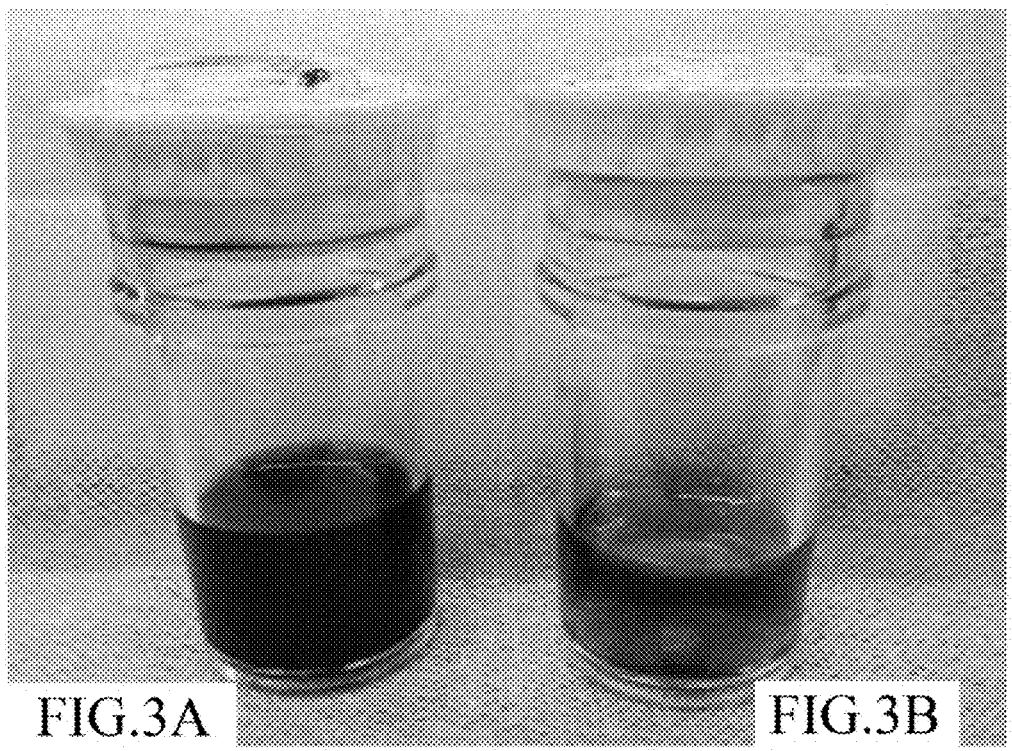
FIGS. 3A and 3B are photographs of the BTB solution showing the result in Test 2.

FIGS. 3A and 3B are photographs showing the results. The lid of the polystyrene container was opened during the test. FIG. 3A shows the case of the non-operational furnace, and FIG. 3B shows the case of the operational furnace.

As shown in FIGS. 3A and 3B, the color of the BTB solution was not changed and retains green (neutrality) for the non-operational furnace, but the BTB solution was changed to yellow showing acidity for the operational furnace. This showed that an oxidative gas was formed through the high temperature heating of the furnace associated with the crystal growth. This also showed that in the ordinary apparatus that was not equipped with the exhaust mechanism according to the present embodiment (i.e., the duct 36, the exhaust fan 38, the harmful substance elimination device 40, and the shroud 42), the oxidative gas was diffused to the surroundings of the furnace and changed the BTB solution to acidity. In consideration of the results in Test 1, the oxidative gas formed in the operational furnace in this test was expected to be nitrogen oxides ($NO_x$) represented by nitrogen dioxide ($NO_2$).

What is claimed is:

1. A production apparatus for generating gallium oxide crystal by melting material of gallium oxide crystal in a furnace in an oxidative atmosphere, the apparatus comprising:
    a crucible being positioned on a center axis of the furnace and housing the material of gallium oxide crystal in an interior of the furnace,
    a heater being disposed in surroundings of the crucible,
    a furnace core pipe being provided between the crucible and the heater and segregating the crucible and the heater from each other,
    an inlet pipe being disposed in a lower part of the furnace and connecting an interior and an exterior of the furnace,
    an exhaust pipe being disposed in an upper part of the furnace and connecting an interior and an exterior of the furnace, and
    a duct being disposed above the furnace,
    wherein an upper end of the inlet pipe and a lower end of the exhaust pipe are disposed apart from each other and directed facing each other,
    an upper end of the exhaust pipe and a lower end of the duct are disposed apart from each other and directed facing each other without being connected to each other, and
    the upper end of the inlet pipe, the lower end of the exhaust pipe, the upper end of the exhaust pipe, and the lower end of the duct are positioned on the center axis of the furnace,
    a shroud surrounding an upper part and a side of the furnace,
    an opening provided in an upper part of the shroud is connected to the lower end of the duct, and
    a lower part of the shroud is opened.

2. The production apparatus according to claim 1, wherein the heater is a resistance heater or an induction heater.

3. The production apparatus according to claim 1, wherein the furnace is a vertical Bridgeman furnace.

* * * * *